US007700270B1

(12) United States Patent
Glebov et al.

(10) Patent No.: US 7,700,270 B1
(45) Date of Patent: *Apr. 20, 2010

(54) DOUBLE-BRAGG-GRATING SCANNING TRANSMITTER/RECEIVER

(75) Inventors: Leonid R. Glebov, Orlando, FL (US); Vadim I. Smirnov, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 964 days.

This patent is subject to a terminal disclaimer.

(21) Appl. No.: 10/834,431

(22) Filed: Apr. 29, 2004

Related U.S. Application Data

(63) Continuation-in-part of application No. 10/665,339, filed on Sep. 19, 2003, which is a continuation-in-part of application No. 09/750,708, filed on Dec. 28, 2000, now Pat. No. 6,673,497, which is a continuation-in-part of application No. 09/648,293, filed on Aug. 24, 2000, now Pat. No. 6,586,141.

(60) Provisional application No. 60/174,432, filed on Jan. 4, 2000.

(51) Int. Cl.
*H01S 3/08* (2006.01)
*G03H 1/02* (2006.01)

(52) U.S. Cl. .............................. 430/320; 430/1; 430/2; 359/3; 359/17; 359/18; 372/102; 372/98; 372/99; 372/100; 372/103

(58) Field of Classification Search ........................ None
See application file for complete search history.

(56) References Cited

U.S. PATENT DOCUMENTS 3,640,604 A 2/1972 Yarnell ................... 350/162 SF
3,675,990 A 7/1972 Kogelnik et al. ............ 350/311
3,721,486 A * 3/1973 Bramley ..................... 359/201

(Continued)

FOREIGN PATENT DOCUMENTS

JP 03-081718 4/1991

OTHER PUBLICATIONS

Wyant 'Rotating diffraction grating laser beams scanner', Appl. Opt., vol. 14(5) pp. 1057-1058 (May 1975).*

(Continued)

*Primary Examiner*—Martin J Angebranndt
(74) *Attorney, Agent, or Firm*—Brian S. Steinberger; Law Offices of Brian S. Steinberger, P.A.

(57) ABSTRACT

Double Bragg grating scanner receivers (DBS) and methods thereof based on spinning high-efficiency transmitting or reflecting holograms in photo-thermo-refractive (PTRG) glass provides unlimited field of view while incident angle for all components do not exceed approximately 45 degrees. The devices and methods are highly tolerable to high power laser radiation and has no restriction for the use in any laser systems working in visible and near IR spectral regions. Rate of scanning by DBS is higher compared to known mechanical scanners because the use of thin glass plates with recorded holograms and spinning instead of rocking. The components described herein are holographic optical devices (reflecting and transmitting volume gratings) for visible and near IR spectral regions with absolute diffraction efficiency exceeding approximately 95% and high thermal, optical and mechanical stability.

20 Claims, 10 Drawing Sheets

U.S. PATENT DOCUMENTS

| | | | | |
|---|---|---|---|---|
| 4,057,408 | A | | 11/1977 | Pierson et al. ............... 65/18 |
| 4,125,405 | A | * | 11/1978 | Araujo et al. ............... 501/13 |
| 4,514,053 | A | | 4/1985 | Borrelli et al. ............ 350/162.2 |
| 4,541,694 | A | | 9/1985 | Sullivan et al. ............ 350/371 |
| 4,567,104 | A | | 1/1986 | Wu ............................. 428/410 |
| 4,670,366 | A | | 6/1987 | Wu ............................. 430/13 |
| 4,871,904 | A | * | 10/1989 | Metlitsky et al. ....... 235/462.38 |
| 4,894,303 | A | | 1/1990 | Wu ............................. 430/13 |
| 4,923,263 | A | * | 5/1990 | Johnson ..................... 359/220 |
| 4,946,253 | A | | 8/1990 | Kostuck ..................... 350/169 |
| 4,965,152 | A | | 10/1990 | Keys et al. ..................... 430/1 |
| 5,078,771 | A | | 1/1992 | Wu ............................. 65/30.11 |
| 5,098,803 | A | | 3/1992 | Monroe et al. ............... 430/1 |
| 5,196,282 | A | | 3/1993 | Knobbe ......................... 430/2 |
| 5,285,517 | A | | 2/1994 | Wu ............................. 385/142 |
| 5,339,305 | A | | 8/1994 | Curtis et al. ............... 369/112 |
| 5,359,403 | A | * | 10/1994 | Grosmann et al. ......... 356/5.01 |
| 5,486,934 | A | | 1/1996 | Huang ........................ 359/15 |
| 5,526,167 | A | * | 6/1996 | Peng ........................ 359/209 |
| 5,546,214 | A | * | 8/1996 | Black et al. ................. 359/203 |
| 5,684,611 | A | | 11/1997 | Rakuljic et al. ................. 359/7 |
| 6,120,976 | A | * | 9/2000 | Treadwell et al. ........... 430/322 |
| 6,792,028 | B2 | * | 9/2004 | Cook et al. ................. 372/102 |
| 7,184,184 | B2 | * | 2/2007 | DeBenedictis et al. ...... 359/196 |
| 7,196,831 | B2 | * | 3/2007 | Broome et al. .............. 359/201 |
| 2002/0045104 | A1 | * | 4/2002 | Efimov et al. ................... 430/2 |

OTHER PUBLICATIONS

Bukharev et al., "Recording of holograms on radiation color centers in glass", Pis'ma v Zhumal Tekhnicheskoi Fiziki vol. 1(21) pp. 975-977 (1975).*

Hirao et al., "Writing Waveguides and Gratings in Silica and Related Materials by a Femtosecond Laser", J. Non-Crystal. Sol., vol. 239 pp. 91-95 (1998).*

Glebov et al. 'Interaction of photo-thermo-refractive glass with nanosecond pulses at 532 nm', Proc. SPIE vol. 5273, pp. 396-401 (Jun. 2004).*

Bryngdahl et al., 'Laser beam scanning using computer generated holograms', Appl. Opt. vol. 15(1) pp. 183-194 (Jan. 1976).*

Glebov et al. "Photoinduced processes in photothermorefractive glasses", Proc. 18th Int. Congr. Glass pp. 1151-1156 (1998).*

Glebov et al. "Polychromatic glasses—a new material for recording vol. phase holograms", Sov. Phys. Dokl vol. 35(10) pp. 878-880 (Oct. 1990).*

Kuchinskii et al. "Properties of volume phase holograms on polychromatic glasses", Opt. Spectrosk, vol. 70(6) pp. 1296-1300 (1991).*

Glebov et al. "New ways to use photosensitive glasses for recording volume phase holograms", Opt. Spectrosc. vol. 73(2) pp. 237-241 (Aug. 1992).*

Maniloff et al. "Maximized photorefractive holographic storage", J. Appl. Phys. vol. 70(9) pp. 4702-4707 (Nov. 1991).*

The Newport Catalog 94/95 (cover, p. 6.9, p. 7.8 and p. 11.2) (1996).*

(1979) A.P. Gararin, L.B. Glebov, O.M. Efimov, O.S. Efimova. Formation of color centers in sodium calcium silicate glasses with the nonlinear absorption of powerful UV radiation. Sov. J. Glass Phys. Chem. 5, pp. 337-340.

(Aug. 1988) IBM Tech. Discl. Bull., vol. 31(3), pp. 18-23.

(1996) P. Hariharan. Optical Holography. Principles, techniques, and applications. Chapter 7: "Practical recording materials," 95-124. Cambridge University Press, pp. 95-97.

(1997) A.V. Dotsenko, L.B. Glebov, V.A. Tsekhomsky, Physics and Chemistry of Photochromic Glasses. CRC Press, Boca Raton, NY., pp. 9-11.

(1999) Efimov, et al. "Laser-induced Damage of Photo-Thermo-Refractive Glasses for Optical-Holographic-Element Writing", SPIE vol. 3578, pp. 564-575.

(1999) O.M. Efimov, L.B. Glebov, S. Grantham, M. Richardson. Photoionization of silicate glasses exposed to IR femtosecond pulses. Journal of Non-Crystalline Solids, 253. 58-67.

(2002) O.M. Efimov, L.B. Glebov, H.P. Andre. Measurement of the induced refractive index in a Photothermorefractive glass by a liquid-cell shearing interferometer. Appl. Optics, 41. 1864-1871.

*Optical Holography Principles, techniques and applications*, second edition, P. Hariharan, Cambridge University Press.

*Full-Color Photosensitive Glass*, S. Donald Stookey, George H. Beall and Joseph E. Pierson, Journal of Applied Physics, vol. 49, No. 10, Oct. 1978, pp. 5114-5123.

*Photolytic Technique for Producing Microlenses in Photosensitive Glass*, Borelli. Morse, Bellman and Morgan. Applied Optics, vol. 24, No. 16. Aug. 15, 1985, pp. 2520-2525.

*Photothermal Refractive Effect in Silicate Glasses*, Borgman. Glebov, Nikonorov. Petrovskii. Savvin and Tsvetkov, Sov. Phys. Dokl. vol. 34. No. 11. Nov. 1989. pp. 1011-1013.

*Polychromic glasses—A New Material for Recording Volume Phase Holograms*, Glebov, Nikonorov, Panysheva, Petrovskii, Savvin, Tunimanova and Tsekhomskiir, Sov. Phys. Dokl, vol. 35, No. 10. Oct. 1990, pp. 878-880.

*New Ways to Use Photosensitive Glasses for Recording Volume Phase Holograms*, Glebov, Nikonorov, Panysheva, Petrovskii, Savvin, Tunimanova, and Tsekhomskii, Opt. Spectrosc., vol. 73, No. 2, Aug. 1992, pp. 237-241.

*Photo-Induced Processes in Photo-Thermo-Refractive Glasses*, Glebov, Glebova, Richardson and Smirnov, XVII International Congress on Glass, San Francisco, CA, Jul. 5-10, 1998.

*High-Efficiency Bragg Gratings in Photothermorefractive Glass*, Efimov, Glebov, Glebova, Richardson and Smirnov, Applied Optics, vol. 38, No. 4, Feb. 1999, pp. 619-627.

*Photo-Thermo-Refractive Glasses for High-Efficiency Bragg Gratings in UV, Visible, and IR Regions*, Efimov, Francois-Saint-Cyr, Glebov, Glebova, Richardson and Smirnov.

* cited by examiner

DOUBLE-BRAGG-GRATING SCANNING TRANSMITTER/RECEIVER

This invention is a Continuation in Part of U.S. patent application Ser. No. 10/665,339 filed Sep. 19, 2003, which is a Continuation-In-Part of U.S. application Ser. No. 09/750,708, filed Dec. 28, 2000, now U.S. Pat. No. 6,673,497, which is a Continuation-in-Part of U.S. application Ser. No. 09/648,293 filed Aug. 24, 2000, now U.S. Pat. No. 6,586,141, which claims the benefit of priority to U.S. Provisional Patent Application 60/174,432 filed Jan. 4, 2000, and was funded in part by the Air Forces Research Laboratory contract No. F496200110469.

FIELD OF THE INVENTION

This invention relates to scanning of collimated optical beams at arbitrary angles by the use of multiple spinning Bragg gratings (both diffractive and refractive) produced by holographic or other photoinduced methods, and in particular to the Bragg gratings produced by sensitization of doped photosensitive silicate glasses to near UV and visible radiation using a two-step illumination in the photo-thermo-refractive (PTR) process.

BACKGROUND AND PRIOR ART

Increasing applications for holographic optical elements have resulted in the continued development of new effective and reliable photosensitive media. P. Hariharan in his book "Optical Holography, Principles, Techniques, and Applications." Chapter 7 (Cambridge University Press, 1996) on pages 95 and 96 reports that the main photosensitive materials available for high efficiency hologram recordings are silver halide photographic emulsions, dichromated gelatin, photoresists, photopolymers, photothermoplastics, polymers with spectral hole-burning, and photorefractive crystals. Each of these materials has their merits, but all have drawbacks. These organic materials (photographic emulsions, dichromated gelatin, and photopolymers) are sensitive to humidity. Moreover, they significantly shrink in the development process. Inorganic materials (photorefractive crystals) have low resistance to elevated temperatures and produce additional patterns because of exposure to the beam diffracted from the recorded grating.

The ideal recording material for holography should have a spectral sensitivity well matched to available laser wavelengths, a linear transfer characteristic, high resolution, and low noise, is indefinitely recyclable or relatively inexpensive. Hariharan reports on page 95 of his earlier referenced book that "While several materials have been studied, none has been found so far that meets all these requirements". The lack of available materials for phase holographs has stimulated the search for new approaches.

A photo-thermal process based on precipitation of dielectric microcrystals in the bulk of glass exposed to UV radiation was reported by S. D. Stookey (see Photosensitive glass, (a new photographic medium). Industrial and Engineering Chem., 41, 856-861 (1949)). Stookey's two-step process (exposure and thermal development) was used to record a translucent image in glass because of light scattering caused by a difference between refractive indices of a precipitated crystalline phase and the glass matrix. Later, colored images were recorded in similar glasses by photo-thermal precipitation of a number of complex crystals of different compositions, sizes, and shapes. According to these studies, the first step is the exposure of the glass sample to UV radiation, which produces ionization of a cerium ion. The electrons released from cerium are then trapped by a silver ion. As a result, silver is converted from a positive ion to a neutral atom. This stage corresponds to a latent image formation and no significant coloration occurs.

The next step is thermal development. This development process includes two stages described in publications by S. D. Stookey, G. H. Beall, J. E. Pierson (see Full-color photosensitive glass. J. Appl. Phys., 49 (1978) 5114-5123) and N. F. Borrelli, J. B. Chodak, D. A. Nolan, T. P. Seward. (see Interpretation of induced color in polychromatic glasses. J. Opt. Soc. Amer., 69 (1979) 1514-1519). The first stage involves the high diffusion rate silver atoms possess in silicate glasses. This diffusion leads to creation of tiny silver crystals at relatively low temperatures (450-500° C.). A number of silver clusters arise in exposed regions of glass after aging at elevated temperatures. These silver particles serve as the nucleation centers for sodium and fluorine ion precipitation and cubic sodium fluoride crystal growth occurs at temperatures between 500° C. and 550° C. Further heat treatment leads to growth of numerous elongated pyramidal complexes of (Na, Ag, F, Br) crystals on the surface of cubic NaF crystals.

This mixture of crystals can produce opal coloration in the case of large crystal sizes or yellow coloration caused by colloidal silver precipitated on interfaces of dielectric crystals. A second exposure to UV followed by a second heat treatment produces different coloration because of metallic silver reduction on the surfaces of the dielectric pyramids. The final resulting coloration depends on the size and aspect ratio of these silver particles. This multi-stage photo-thermal process in photosensitive glass was proposed for decoration, color photography, sculpture, and even for holography; however, no evidences of any hologram recorded in these glasses are in those references. Several years later, the use of inorganic photosensitive glasses for phase hologram recording rather than as a photographic medium was reported in the literature: Bragg gratings were obtained both in lithium-aluminum-silicate and sodium-zinc-aluminum-silicate glasses doped with silver and cerium by exposure to UV radiation followed by thermal treatment. This phenomenon was described in following publications (V. A. Borgman, L. B. Glebov, N. V. Nikonorov, G. T. Petrovskii, V. V. Savvin, A. D. Tsvetkov. Photothermal refractive effect in silicate glasses. *Soy. Phys. Dokl.*, 34 (1989) 1011-1013. L. B. Glebov, N. V. Nikonorov, E. I. Panysheva, G. T. Petrovskii, V. V. Savvin, I. V. Tunimanova, V. A. Tsekhomskii. Polychromatic glasses—a new material for recording volume phase holograms. Soy. Phys. Dokl., 35 (1990) 878-880) and named the "photo-thermo-refractive" (PTR) process. Glasses, which possess such properties, were called "photo-thermo-refractive" (PTR) glasses.

It was further reported that a refractive index decrease of about $5 \times 10^{-4}$ occurs when dielectric crystals precipitated in PTR glasses are exposed to ultra violet (UV) radiation of a nitrogen laser at 337 nm. The refractive index of NaF in the red spectral region is $n_{NaF}=1.32$ whereas the refractive index of PTR glass $n_{PTR}=1.49$. The small value of refractive index change is due to the small volume fraction of precipitated crystalline phase; however, it is sufficient to result in high efficiency Bragg grating recording in samples with thicknesses more than several hundreds of microns. Conditions of glass exposure and development were found in that work to create Bragg gratings with relative diffraction efficiencies up to 90% and angular selectivity up to 2 mrad. The maximum recorded spatial frequency was 2500 mm$^{-1}$. These gratings were also stable up to 400° C. UV photosensitivity was found in the range of several J/cm² at a nitrogen laser wavelength (337 nm). The absorption band of $Ce^{3+}$, which is used for photo-ionization, has maximum near 300 nm and a long wavelength tale up to 400 nm. This means that several commercial lasers such as $N_2$, Ar, He—Cd, etc., can be used for recording. Once developed, holograms in PTR glass were not destroyed by further exposure to visible light.

Unfortunately, these reported materials did not meet all requirements formulated in Hariharan, particularly absolute diffraction efficiency [P. Hariharan. Optical Holography, Principles, Techniques, and Applications." Chapter 7 pp. 95-124 (Cambridge University Press, 1996), Table 7.1 at page 96] because their property of excessive (strong) scattering of the radiation imposed on the hologram. This scattering results in low absolute diffraction efficiency of gratings in PTR glasses, which has been found not to exceed 45%. Thus, this PTR material for holographic optical elements had serious drawbacks; particularly, inadequate absolute diffraction efficiency which results in excessive scattering of the radiation as well as photosensitivity solely for UV radiation.

A new approach for the production of phase holograms having many of these desired properties is described in the patent utility application U.S. Pat. No. 6,586,141 Jul. 1, 2003, by the same assignee as that of the subject invention. This Patent teaches how a photo-thermal process based on precipitation of dielectric microcrystals in the bulk of glass exposed to UV radiation can be used to record a high-efficiency volume phase hologram in glass having a photosensitivity to UV radiation resulting from the difference between refractive indices of the UV exposed and unexposed areas of the PTR glass blank.

However, photosensitivity of PTR glass is restricted in the vicinity of the absorption band in the near UV spectral region. This restriction means that plane holographic elements could be fabricated with this method for visible and IR spectral regions while complex holograms could be recorded for the UV region only. It would be highly desirable to produce a recording material for holography with photosensitivity to visible radiation.

Another application of photosensitive materials which can increase their refractive index is the fabrication of refractive optical elements, such as lenses or waveguides as are described in the book by K. Hirao at al. (Active Glass for Photonics Applications. Springer-Verlag, Berlin 2001). However, the PTR glass was not used for such a technology because it showed a decrease of refractive index after UV exposure and thermal development. It would be highly desirable to produce a recording material for refractive optical elements and waveguides fabrication with high sensitivity, positive refractive index increment, and high tolerance to elevated temperatures, high-power optical radiation, and harsh environmental conditions. Thus, U.S. patent application Ser. No. 10/666,339 filed Sep. 19, 2003, by the same assignee as the subject invention teaches to make high efficient complex holographic elements that can control laser beams of different shape and angular divergence.

Additionally, U.S. Pat. No. 6,673,497 B2. Jan. 6, 2004, by the same assignee of the subject invention, which is incorporated by reference teaches to make a number of holographic optical elements based on high efficiency volume Bragg gratings in PTR glass including laser beam deflectors or scanners (examples 9 and 10). Those gratings produce deflection of laser beam to fixed angles. Scanning could be produced by mechanical replacement of multiple gratings recorded at one substrate or controlled by small angle or wavelength scanning of an incident beam.

This device can be effectively utilized in combination of PTR volume Bragg gratings with liquid crystal, electro-optic or acousto-optic laser beam control (see e.g. D. P. Resler, D. S. Hobbs, R. C. Sharp, L. J. Friedman, T. A. Dorschner. Opt. Let., 21 (1996) 689-672, and Z. Yaqoob, M. A. Arain, and N. A. Riza, High-speed two-dimensional laser scanner based on Bragg gratings stored in photothermorefractive glass. Appl. Opt. 42(26) (2003) 5251-5263). The main drawback of such Bragg scanners is their impossibility for fine tuning of the angle of deflection. To compensate this drawback, the second fine tuning by liquid crystal array was proposed in Ref. Resler, etc. Finally, this combination of consequent deflection by liquid crystal, stack of Bragg gratings, and once more by liquid crystal is probably most advanced reported scanner having wide angle of regard while no moving parts. However, this device is very expensive.

Classical scanning system for collimated laser beams consists of two consequent rotating mirrors which deflect beam in two orthogonal directions. One can see such devices in any laser show. The main disadvantage of such device is necessity of system rotating around the axis placed on the surface of the mirror. Such scheme results in large volume occupied by the device and high force required for reasonable fast scanning. Those features lead to tiny devices which are not tolerable to any vibrations (e.g. galvanometers for laser show) or bulky and weighty gimbals (laser scanners for military and technology applications). Such mechanical devices are significantly cheaper compare to the previous one but rate of scanning is lower by orders of magnitude. However, those devices are most reliable and they are in use up to nowadays. One of the examples of the use of such approach is 360° panoramic surveillance system with the use of a mirror rotating in azimuth plane and rocking in the elevation plane (Gerald Kerbyson. High-resolution full-panoramic imaging surveillance system. Sensors, and Command, Control, Communications, and Intelligence. Technologies for Homeland Defense and Law Enforcement, Edward M. Carapezza, Editor, Proceedings of SPIE 4708 (2002) 173-183.)

The use of holographic gratings for laser beam scanning was proposed at least 30 year ago (I. Cindrich, Appl. Opt. 6, 1531 (1967), D. H. McMahon, A. R. Franklin, and J. B. Thaxter, Appl. Opt. 8, 399 (1969), C. S. Ih. Holographic laser beam scanners utilizing an auxiliary reflector. Appl. Opt. 16 (1977) 2137-2146). These publications teach to place a great number of thin holographic gratings to the same disk and produce scanning to the fixed angles by spinning of the disc. Each hologram would deflect beam to different direction. This approach allows decreasing of the size and weight at least two times compare to rotating mirrors. However, the only fixed number of fixed angles (usually no more that a few of thousands) could be realized in such devices while actual number of pixels about $10^6$ is required for high quality scanners as laser radars, etc., It is obvious that spinning of any diffractive grating results in conic scanning of a diffracted beam. This approach is used for laser radar design in Ref. (Schwemmer, G., Conically Scanned Holographic Lidar Telescope, U.S. Pat. No. 5,255, 065, 1993), which is incorporated by reference. This device provides precise azimuthal scanning of laser beam for 360°. However, it does not allow scanning along the elevation angle. Therefore, total solid angle of regard is small compare to $4\pi$.

Two consequent counterrotating holographic elements were proposed in Ref. (A. Brameley U.S. Pat. No. 3,721,486, which is incorporated by reference and, J. C. Wyant. Rotating Diffraction Grating Laser Beam Scanner. Appl. Opt. 14 (1975) 1057-1058). Those elements provided linear scanning of leaser beam with variable speed. However, no discussion on scanning of the large solid angles was found in those references.

New approach in mechanical scanners is based on rotating of consequent prisms or lenses that can deflect laser beams. Those devices are more tolerable to vibrations compare to galvanometers but they usually have small fields of view because increasing of deflection angle leads to very fast increasing of size and weight of the device (Ref. . . . ). No evidences of similar approach with holographic optical elements were found. Probably it is resulted from low absolute diffraction efficiency of existing holographic optical elements.

Thus, the need exists for systems to utilize these novel PTR holographic optical elements with high absolute diffraction efficiency for large solid angle laser beam scanner.

SUMMARY OF THE INVENTION

A first objective of the present invention is to provide efficient scanning of a laser beam at arbitrary angles by plural spinning Bragg gratings.

A second objective of the present invention is to provide efficient scanning of a collimated optical beam at arbitrary angles by spinning Bragg gratings.

A third objective of this invention is to provide an efficient scanning receiver of optical radiation with low divergence and an unlimited field of view by multiple spinning Bragg gratings.

A fourth objective of this invention is to provide a highly efficient scanning receiver of optical radiation with low divergence and an unlimited field of view by multiple highly efficient spinning Bragg gratings.

Preferred embodiments of the invention include: (A) a method of scanning of collimated optical beams at arbitrary angles comprising the steps of: single or multiple exposing PTR glass with a UV light source or other source of ionizing radiation; thermal treating the exposed PTR glass; preparing a plurality of holograms from the thermal treated PTR glass as Bragg gratings; and, spinning at least two of said Bragg gratings and (B) a scanning receiver of collimated optical beams at arbitrary angles.

The UV light source can include a range of approximately 280 to approximately 350 nm., and include approximately 325 nm.

The ionized and UV light source exposed glass can be followed by exposure to high-power Visible radiation having a range of approximately 450 to approximately 600 nm, and include approximately 532 nm.

The exposure to Visible radiation can be done by a high power source generating at approximately 10 megawatts/cm$^2$ to approximately 100 gigawatts/cm$^2$, and preferably include a source of at least approximately 100 megawatts/cm$^2$. The high power source can also generate at approximately 10 gigawatts/cm$^2$.

The plurality of simple holograms can have substantially planar surfaces of equal refractive index.

The plurality of complex holograms can have substantially curved surfaces of equal refractive index.

Thermal treating the PTR glass can include a temperature region ranging from approximately 480 to approximately 580° C. for a period of from a few minutes to several hours appropriate for phase transformation.

The Bragg gratings can have substantially planar surfaces of equal refractive index.

The preferred embodiments can include a multiplicity of Bragg gratings generated from thermal treated PTR glass previously exposed to a UV light source; and, means provided for spinning of at least two of said Bragg gratings.

Further objectives and advantages of this invention will be apparent from the following detailed description of the presently preferred embodiments which are disclosed in the following text and properties of which are illustrated in the accompanying drawings.

DESCRIPTION OF THE PREFERRED EMBODIMENTS

Figure 1:
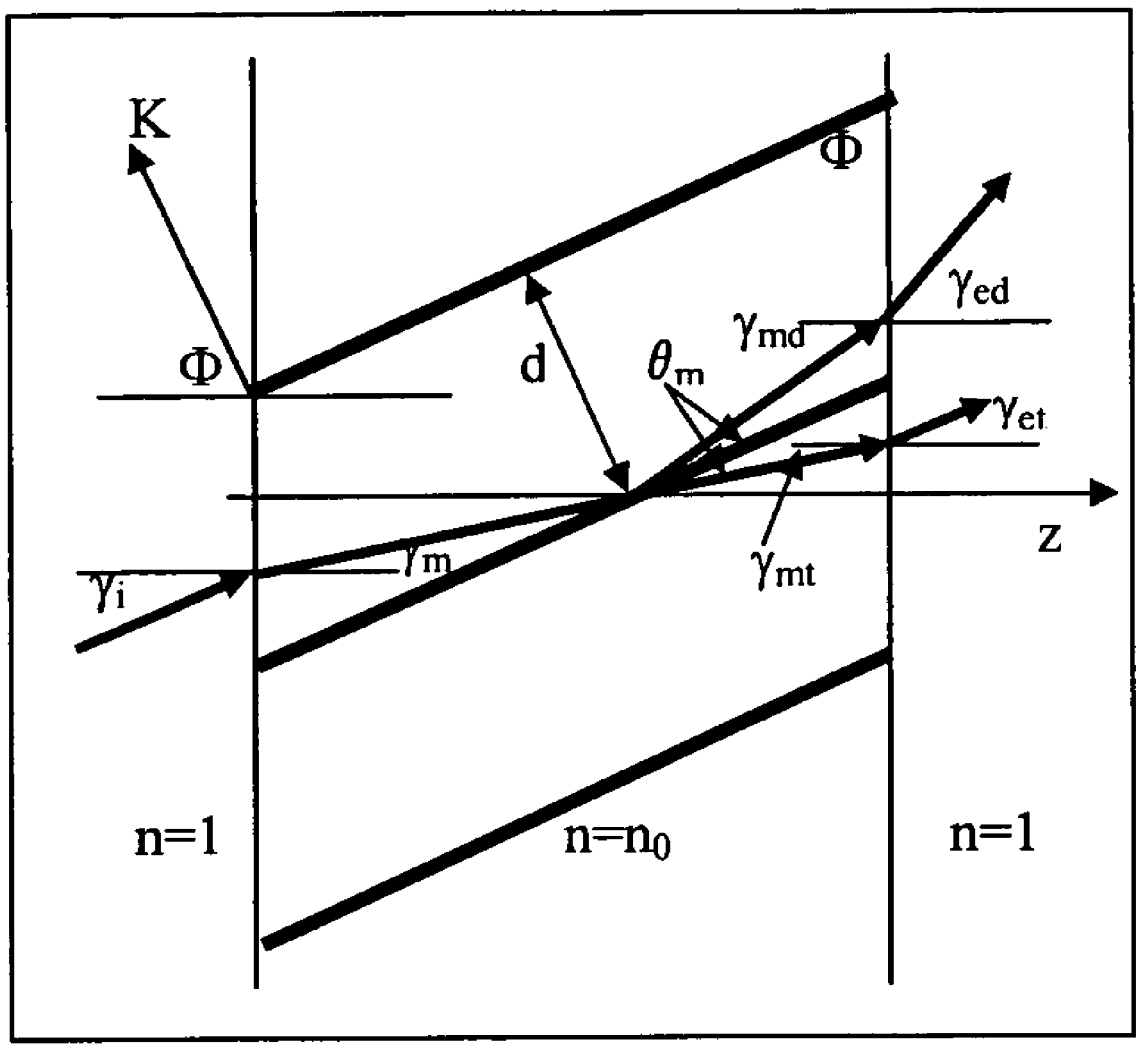
FIG. 1 shows rays tracing in a tilted Bragg grating.

Before explaining the disclosed embodiments of the present invention in detail, it is to be understood that the invention is not limited in its application to the details of any particular arrangements shown since the invention is capable of further embodiments. Also, the terminology used herein is for the purpose of description and not of limitation.

To overcome the drawbacks of the prior art in developing useful glass holograms, it was necessary to establish if the high losses (excessive scattering) are an intrinsic feature of photo sensitive refractive (PTR) glasses or, with proper choices of glass technology, conditions of exposure and/or thermal development, this phenomenon can be eliminated. To do this, studies were made of: PTR glass melting and samples preparation; absorption spectra of original, exposed and developed PTR glasses in the UV, visible, and IR regions; Bragg grating optical properties versus conditions of PTR glass fabrication, UV exposure and thermal treatment; and, the types of losses, which appeared in the process of hologram recording.

These numerous studies have resulted in unique processes described in: U.S. Pat. No. 6,673,497 issued Dec. 28, 2003; U.S. Pat. No. 6,586,141 issued Aug. 24, 2003; and, U.S. patent application Ser. No. 10/666,339 filed Sep. 19, 2003, of common assignee with this application and which are fully incorporated herein by reference. These inventions thereto produce a new inorganic PTR glass as a medium for ultra violet (UV) hologram recording and as a medium for visual hologram recording with the properties and performance which meets the requirements indicated above.

Absorption spectra of PTR glasses show the UV part of absorption spectrum based on the wide absorption band of $Ce^{3+}$ with maximum at approximately 305 nm. The range of photosensitivity of this glass is from approximately 280 to approximately 350 nm with absorption of the PTR glass less than approximately 0.01 $cm^{-1}$ in the visible and near IR regions which indicates that PTR glass is more transparent than usual optical crown glass and can be used in the near UV, visible and IR region up to approximately 4000 nm.

The durability of holograms in PTR glasses is remarkable for it was found that secondary heat treatment up to approximately 400° C. does not reduce diffraction efficiency. The developed holograms were exposed to radiation of 100 W Yb laser at approximately 1096 nm and 30 mW He—Cd laser at approximately 325 nm for approximately 5 to approximately 8 hours without any hologram destruction. Laser damage threshold for approximately 10 ns approximately 1064 nm laser radiation was about 40 J/cm².

As is apparent from the goals of this invention is to provide both a transmitter and receiver capable of scanning of both a laser beam and a collimated optical beam at arbitrary angles at arbitrary angles, this invention discloses how such devices can be prepared from both transmitting and reflecting Bragg gratings.

A description of diffractive beam scanner was realized by the subject inventors in March 2003. This device consist of two consequent spinning Bragg grating and can deflect collimated beam to arbitrary direction with a maximum deflection angle exceeding ±90° and collect collimated radiation from the same arbitrary angle.

Let us consider Bragg grating recorded in a parallel-sided plate of a photosensitive material, e.g. PTRG as it is shown in FIG. 1. Thick solid lines are planes of constant refractive index of Bragg grating, which are perpendicular to the plane of drawing. K—grating vector perpendicular to the plane of constant refractive index. Scalar of vector $\vec{K}$ is referenced by equation 1 as follows:

$$|\vec{K}| = \frac{2\pi}{d} = 2\pi f, \tag{1}$$

where d is a grating period and $f=d^{-1}$ is a spatial frequency, $\Phi$—angle between grating vector and the normal to the front surface, $n_0$—average refractive index of exposed photosensitive material at the wavelength of reconstruction, $\gamma_i$—incident angle, $\gamma_m$—angle of refraction in the medium, $\gamma_{mt}$—incident angle of transmitted beam at the rear surface of the medium, $\gamma_{md}$—incident angle of diffracted beam at the rear surface of the medium, $\gamma_{et}$—exit angle of transmitted beam, $\gamma_{ed}$—exit angle of diffracted beam, $\phi_m$—Bragg angle in the medium.

Let us calculate deflection angle for tilted transmitting grating. For a parallel-sided plate, $\gamma_i=\gamma_{et}$ exit angle for a transmitted beam is equal to the incident one. Deflection angle is a difference between transmitted and diffracted exit beams as represented in the following:

$$\delta = \delta_{ed} - \gamma_{et} \tag{2}$$

$$\gamma_{et} = \gamma_i = \arcsin(n_0 \sin \gamma_m) \tag{3}$$

$$\gamma_{ed} = \arcsin(n_0 \sin \gamma_{md}) \tag{4}$$

$$\gamma_m = \gamma_{mt} = \pi/2 - \Phi - \theta_m \tag{5}$$

$$\gamma_{md} = \pi/2 - \Phi + \theta_m \tag{6}$$

Substitute (5) and (6) to (3) and (4) and then to (2):

$$\delta = \arcsin[n_0 \cos(\Phi - \theta_m)] - \arcsin[n_0 \cos(\Phi + \theta_m)] \tag{7}$$

Let us consider rotating of a grating around direction of an incident beam. For any grating position, the beam would be deflected at angle δ in the plane produced by the incident beam and the grating vector. In this case, diffracted beam would rotate around the same axis describing a cone with a vertex angle equal to the doubled deflection angle in equation (7). To simplify estimations, let us have Bragg grating with an incident angle equal to zero (normal incidence) as shown in the following:

$$\gamma_{et} = \gamma_i = \gamma_m = 0 \tag{8}$$

Substitute (8) to (5):

$$\Phi = \pi/2 - \theta_m \tag{9}$$

Substitute (9) to (7):

$$\delta = \arcsin(n_0 \sin 2\theta_m) \tag{10}$$

Bragg angle in a medium is:

$$\theta_m = \arcsin \frac{\lambda}{2 n_0 d} \tag{11}$$

Substitute (11) to (10):

$$\delta = \arcsin\left[n_0 \sin\left(2 \arcsin \frac{\lambda}{2 n_0 d}\right)\right] \tag{12}$$

Figure 2:
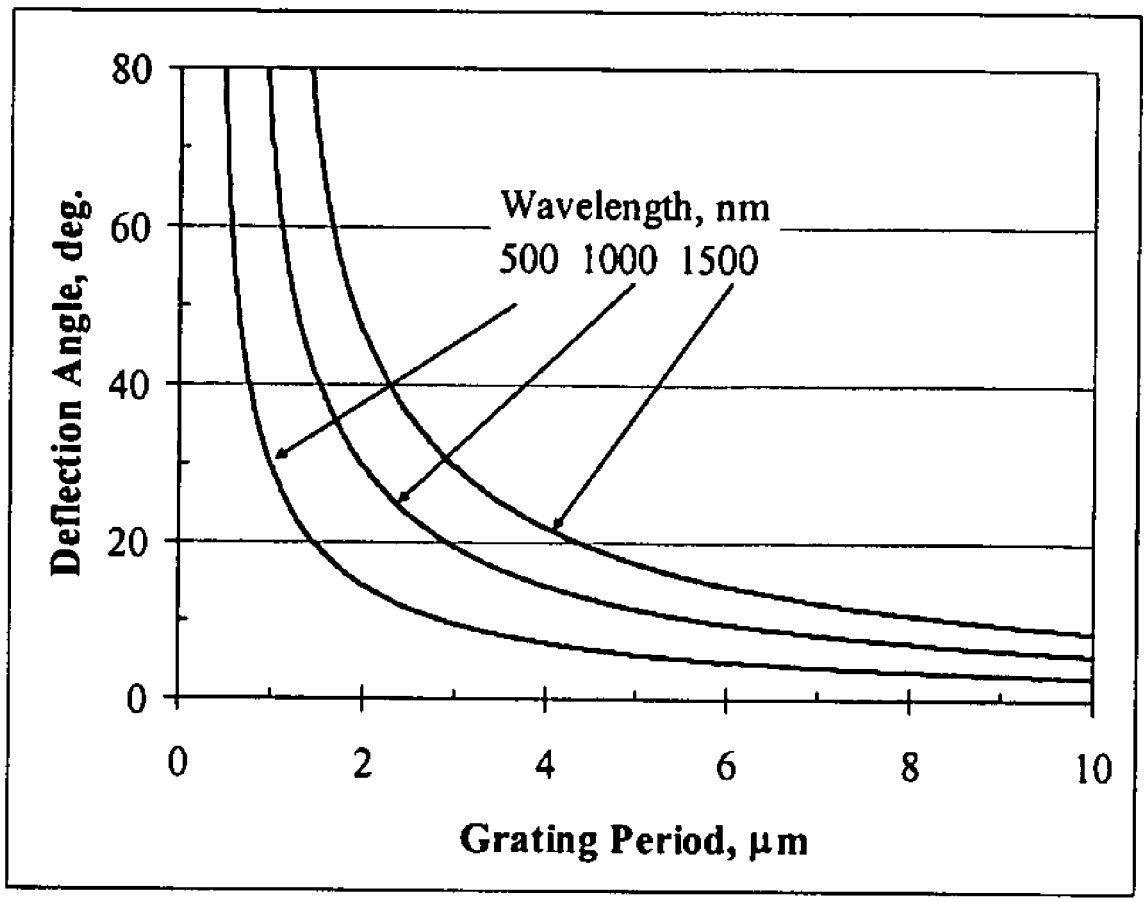
FIG. 2 shows the deflection angle produced by a Bragg grating with normal incident angle versus grating period.

FIG. 2 shows dependence of a deflection angle on grating period for different wavelengths. Maximum deflection angle of 90° is determined by total internal reflection of a diffracted beam on the back surface of the glass blank. Spinning of such grating around its axis causes the conic scanning of the deflected beam. Let us keep exit angle for a diffracted beam in the range of approximately 45° to avoid polarization sensitivity of Bragg grating and significant losses because of approaching to the angle of total internal reflection. In this case, a full vertex angle describing by diffracted beam should be up to 2×45°=90°. Those deflection angles correspond to moderate grating periods ranged from about 0.7 μm for wavelength of approximately 500 nm to about 2 μm for wavelength of approximately 1500 nm.

Figure 3:
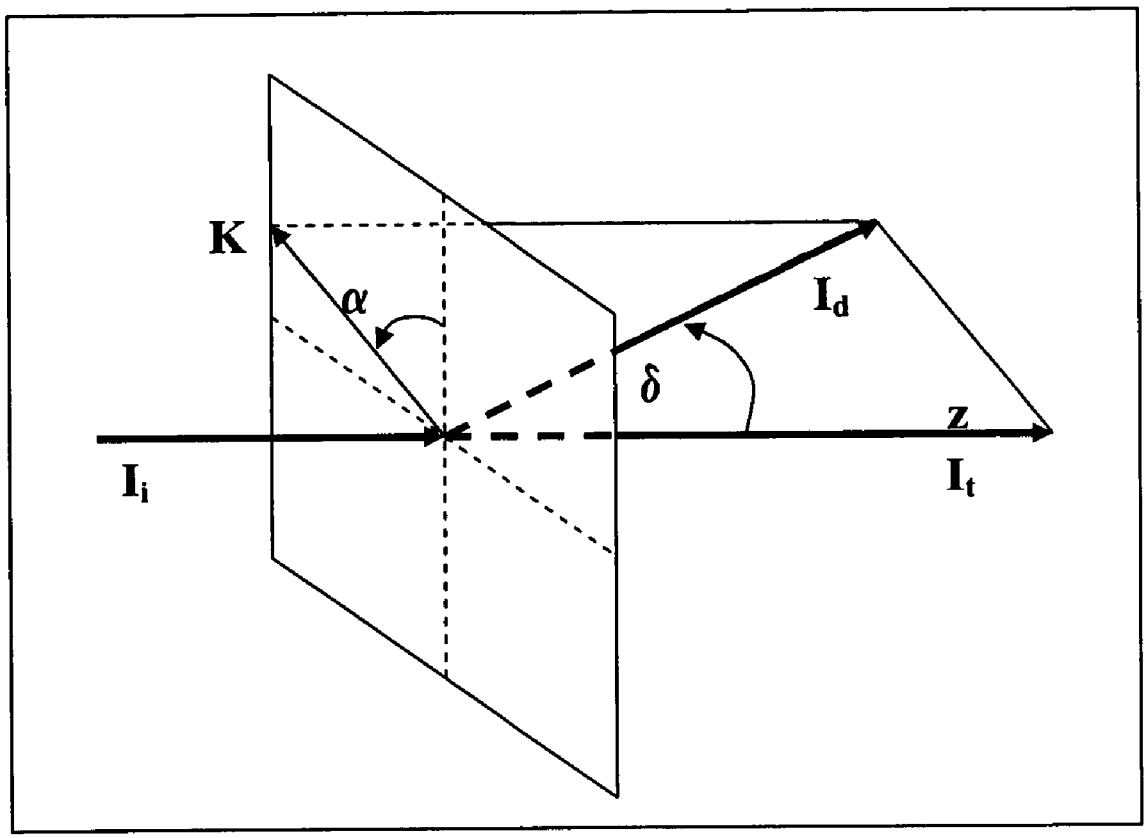
FIG. 3 illustrates the deflection of a beam by Bragg diffractive grating with zero incident angle. $I_i$, $I_t$, and $I_d$ which are incident, transmitted, and diffracted beams, respectively. α is the angle between projection of a grating vector to the plane of rotation and a vertical direction in the plane of drawing, δ is a deflection angle laying in the plane produced by an incident beam and grating vector.

Let us describe direction of a beam deflected by Bragg grating in dependence on grating orientation (FIG. 3). Incident beam is deflected by Bragg grating in the plane produced by incident beam and grating vector. Let us determine beam trajectory in cylindrical coordinates connected with grating where axis z is perpendicular to the plane of glass blank; azimuth angle $\alpha$ lies in the plane of hologram, it value counted from vertical axis in counter-clockwise direction if looking along the beam propagation z.

Thus, $\alpha$ equals to deviation of grating vector projection from the vertical axis. Deflection angle $\delta$ is the angle between transmitted and diffracted beams. It lies in the plane produced by incident beam z and grating vector K. Rotation of the grating around axis of an incident beam z results in conic scanning of a deflected beam with vertex angle equal to the doubled deflection angle in equation (12). Dependence of azimuth and elevation on time are given by:

$$\alpha = 360Rt$$

$$\delta = \text{const} \quad (13)$$

where R is rotation rate, t is time.

Figure 4:
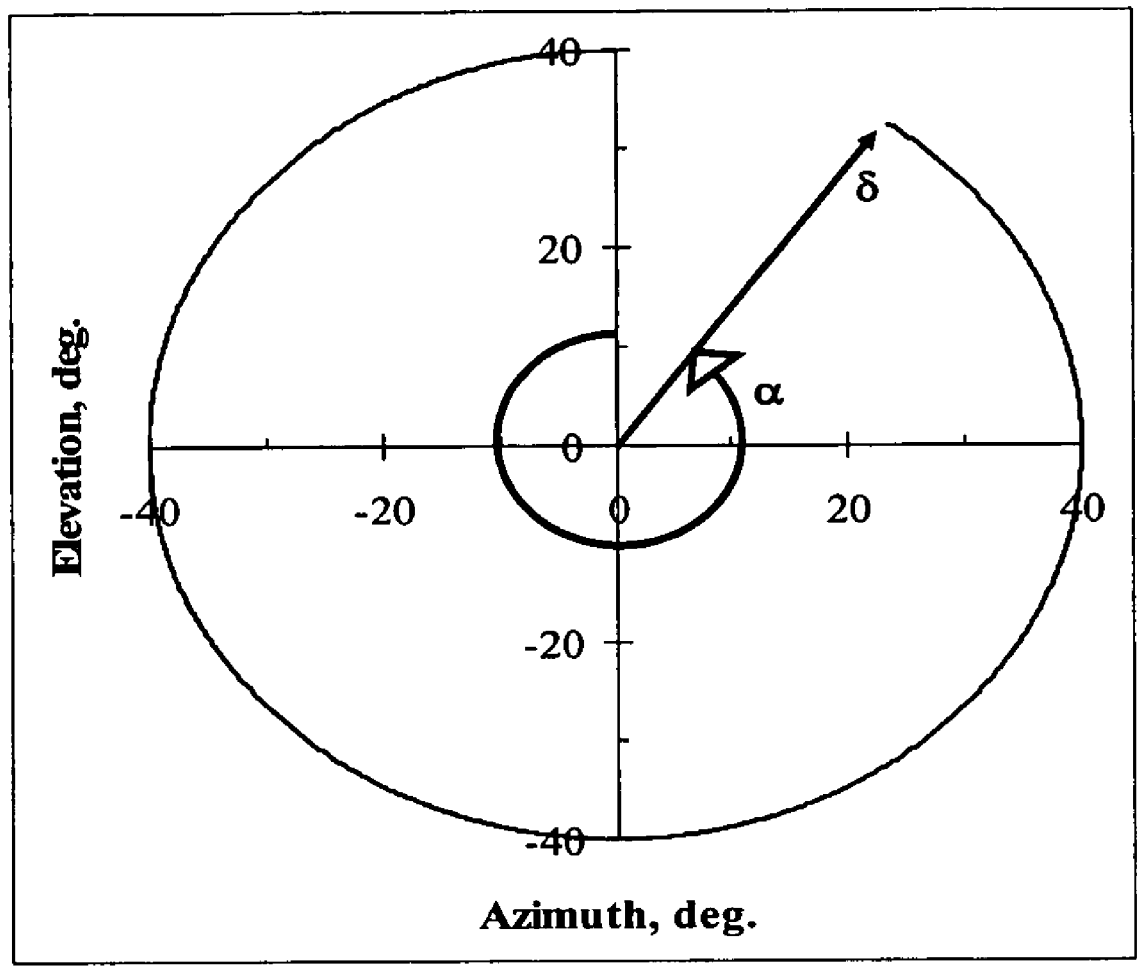
FIG. 4 illustrates the trajectory of the beam deflected by a rotating Bragg grating which has a deflection angle approximately 40°, rotation rate approximately 1 rps, over a time period of approximately 0.9 s.

Let us go to the external polar coordinates having the same direction of axis z and angular coordinates which are azimuth (A) and elevation (E) as it shown in FIG. 4. Rotation of the grating results in the beam trajectory in the plane perpendicular to axis:

$$A = -\delta \sin \alpha$$

$$E = \delta \cos \alpha \quad (14)$$

This trajectory is shown in FIG. 4. One can see the simple conic trajectory.

Let us consider deflection of a beam by two consequent gratings with the same deflection angle which are placed in such way that the incident angle of the second grating coincides with deflection angle of the first one and both gratings can be spin around their axes. This means that the second grating is rotated by the first one and has its own spinning too. Geometry of beam deflection is shown in FIG. 5 with the same coordinates as in FIG. 4.

Figure 5:
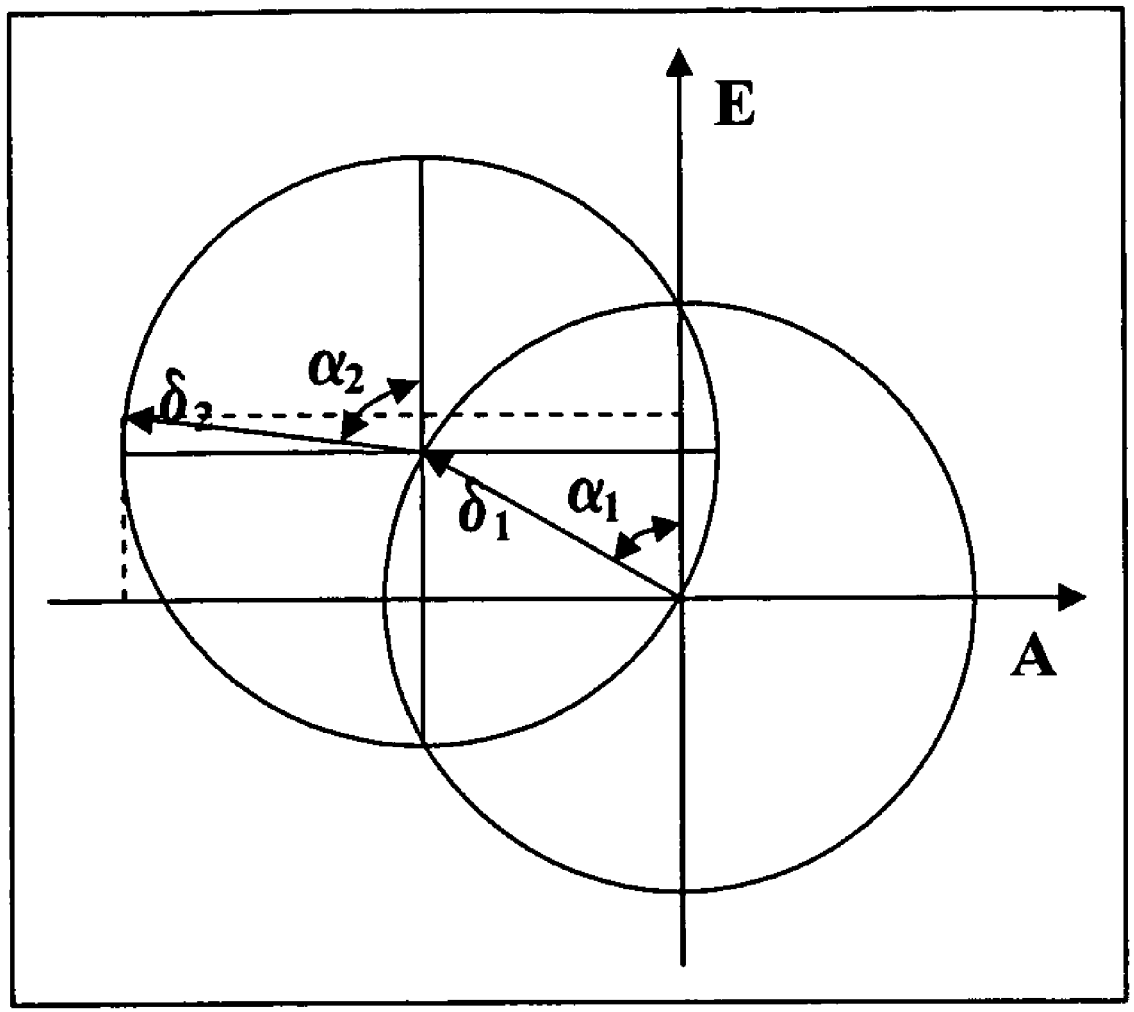
FIG. 5 illustrates the deflection of a beam by two consequent Bragg diffractive gratings with zero incident angles wherein a is the angle between projection of a grating vector to the plane of rotation and a vertical direction in the plane of drawing and δ is a deflection angle laying in the plane produced by an incident beam and grating vector.

One can see in FIG. 5 that spinning of the second grating being placed on the circle with radius $\delta_1$ provides directing of the double-deflected beam to an arbitrary point within radius of 2δ. This procedure can be achieved by two combinations of $\alpha_1$ and $\alpha_2$ for any point except the outer diameter where it could be done by a single combination only.

Figure 6:
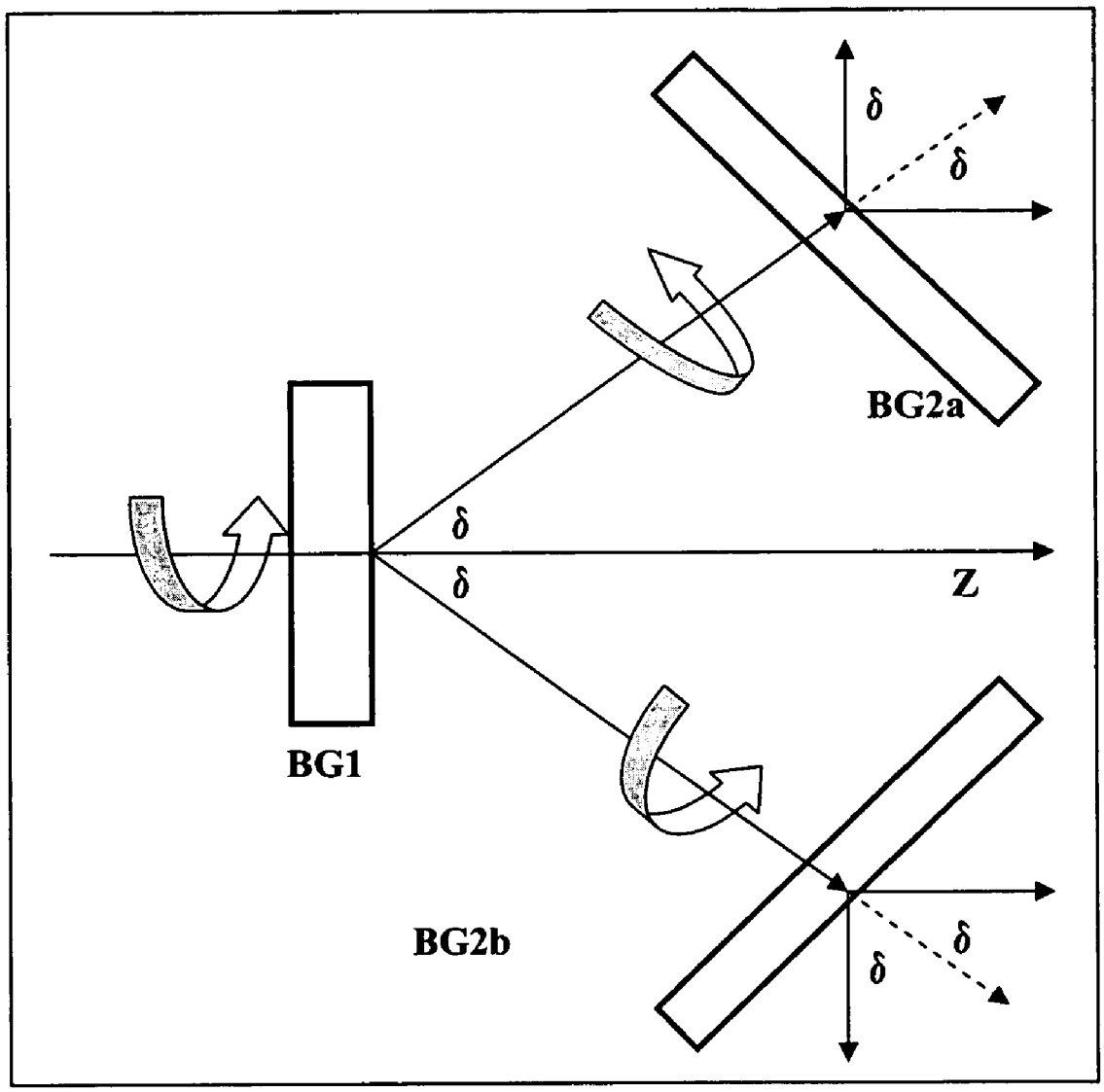
FIG. 6 illustrates the deflection of a beam by two consequent Bragg diffractive gratings with zero incident angles and deflection angles of approximately 45 where the full field of view is approximately 180°.

While FIG. 5 shows beam deflection in a projection along the axis Z, FIG. 6 shows beam scanning in a perpendicular direction. Two gratings are depicted in FIG. 6 with deflection angles of approximately 45°. One can see that spinning of the second grating in upper position provide beam scanning from 0° to −90°. Half-turn of the first gratings transfers the second one to the lowest position, and its spinning provide beam scanning from 0° to approximately +90°. So, one can see that total field of view for double Bragg-grating scanner (DBS) is 4δ or eight Bragg angles in the air.

Let us calculate beam trajectory for different spinning rates:

$$\alpha_1 = 360R_1 t$$

$$\alpha_2 = 360R_2 t$$

$$\delta_1 = \delta_2 = \text{const} \quad (15)$$

Trajectory in external coordinates is:

$$A = -\delta(\sin \alpha_1 + \sin \alpha_2)$$

$$E = \delta(\cos \alpha_1 + \cos \alpha_2) \quad (16)$$

Figure 7C:
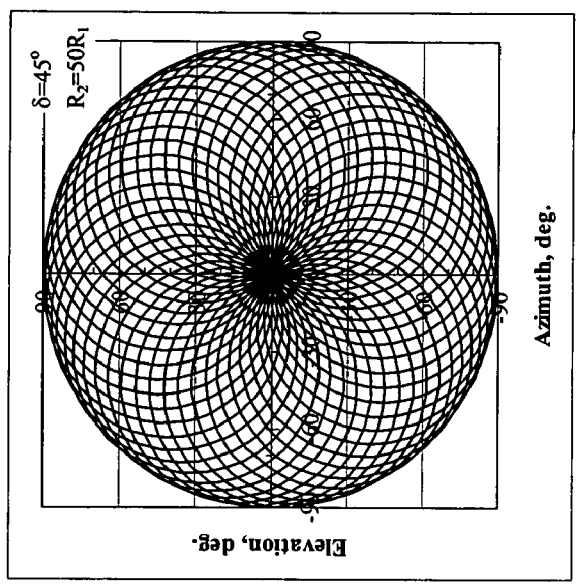
FIGS. 7a, 7b and 7c illustrates the trajectories of a laser beam produced by the double grating scanner after a single revolution of the first grating wherein the deflection angle of each grating δ=approximately 45°, for different rotation rates R, and φ is initial phase of a local azimuth angle.
Figure 7B:
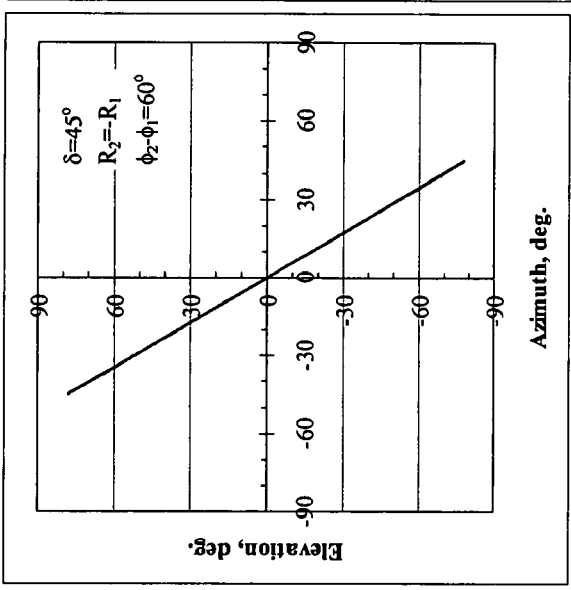
Figure 7A:
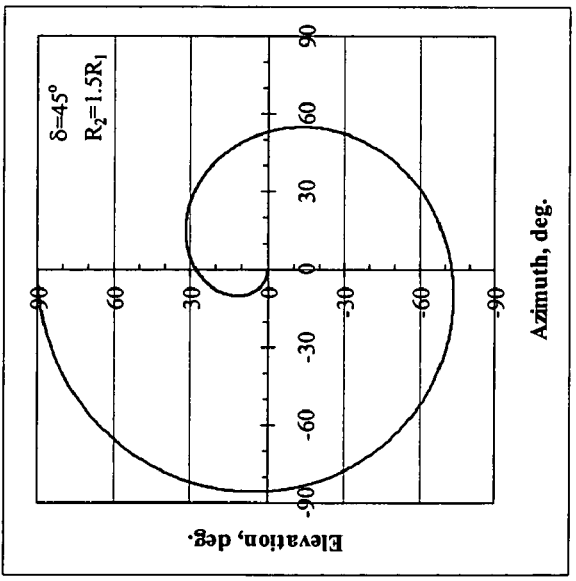

Scanning trajectories are shown in FIGS. 7a where $R_2 = 1.5 R_1$, 7b where $R_2 = R_1$ and 7c where $R_2 = 50 R_1$ for elevation degrees vs. azimuth degrees. One can see once more that double grating scanner provide field of view of approximately 180° for gratings with deflection angles δ of approximately 45°. Different ratios between rotation rates ($R_1$ and $R_2$) and different phase shifts between $\alpha_1$ and $\alpha_2$ results in different patterns of scanning, and where φ is initial phase of a local azimuth angle. It is clear that proper choice of parameters can provide desirable trajectories of total coverage of half-space.

Weight and size of such device is significantly lower compare to any similar device with mechanical motion of parts. At the same time, rate of scanning and field of view are incomparably higher for DBS. In comparison with electro-optical devices (e.g. liquid crystals combined with Bragg gratings), rate of scanning is lower but field of view is several times higher while price should be order of magnitude less.

However, even higher field of view can be achieved with the use of gratings having not normal incidence angle. Let us substitute Bragg condition (11) to (7):

$$\delta = \arcsin\left[n_0 \cos\left(\Phi - \arcsin\frac{\lambda}{2n_0 d}\right)\right] - \arcsin\left[n_0 \cos\left(\Phi + \arcsin\frac{\lambda}{2n_0 d}\right)\right] \quad (17)$$

Figure 8:
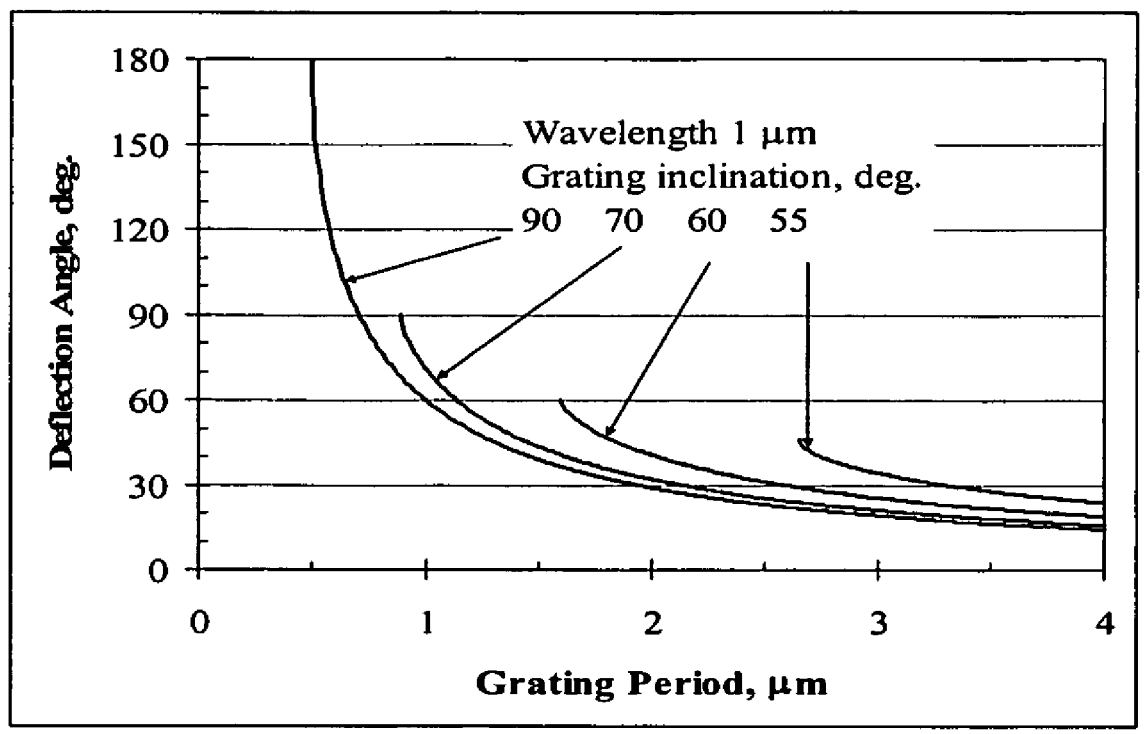
FIG. 8 illustrates the dependence of the Bragg grating deflection angle on the period for different angles of grating inclination in respect of a glass plate and a wavelength of approximately 1 μm.
Figure 9:
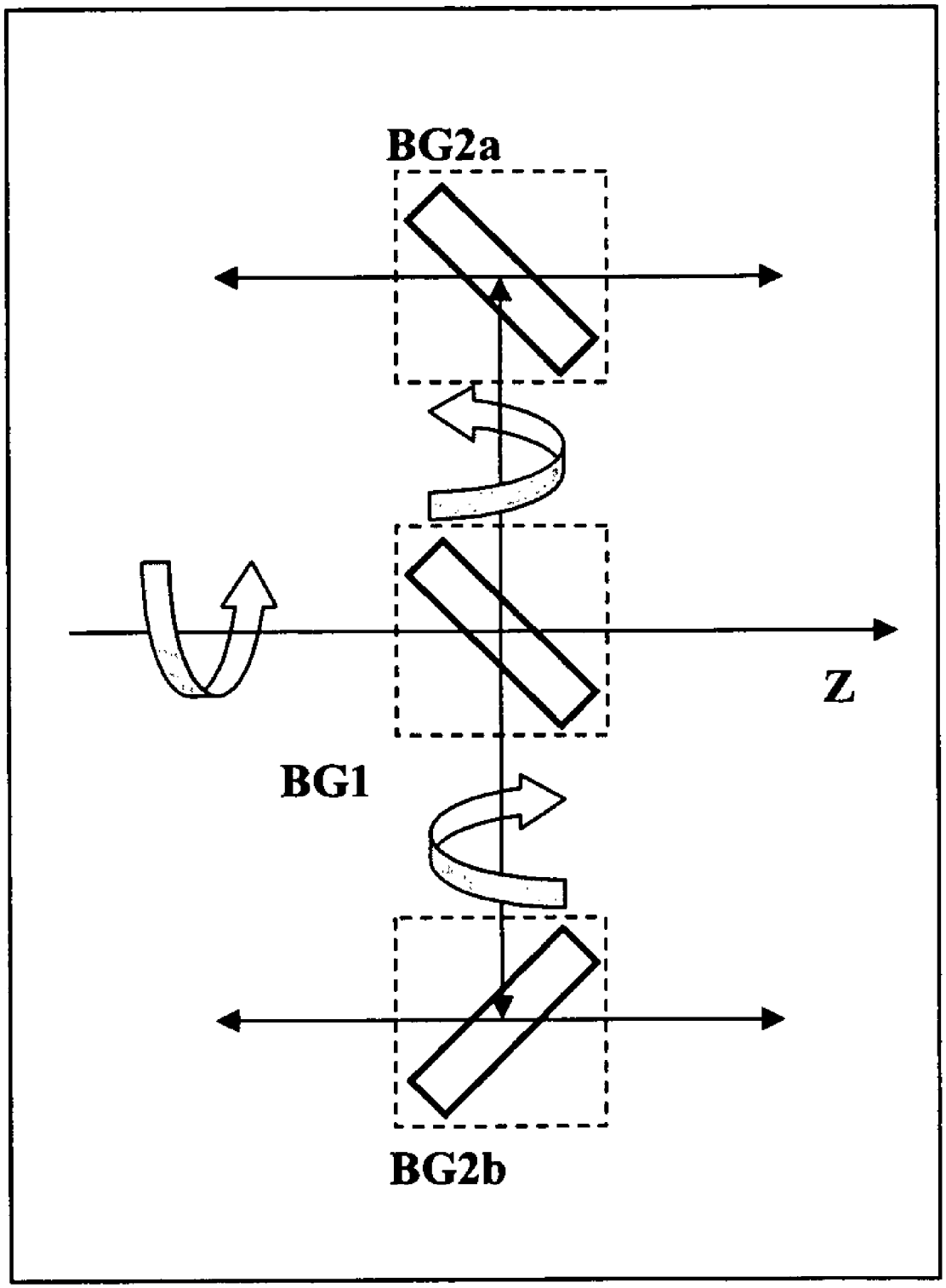
FIG. 9 illustrates the deflection of a beam by two consequent symmetric Bragg diffractive gratings with deflection angles of approximately 90° wherein the full field of view is approximately 360°
Figure 10:
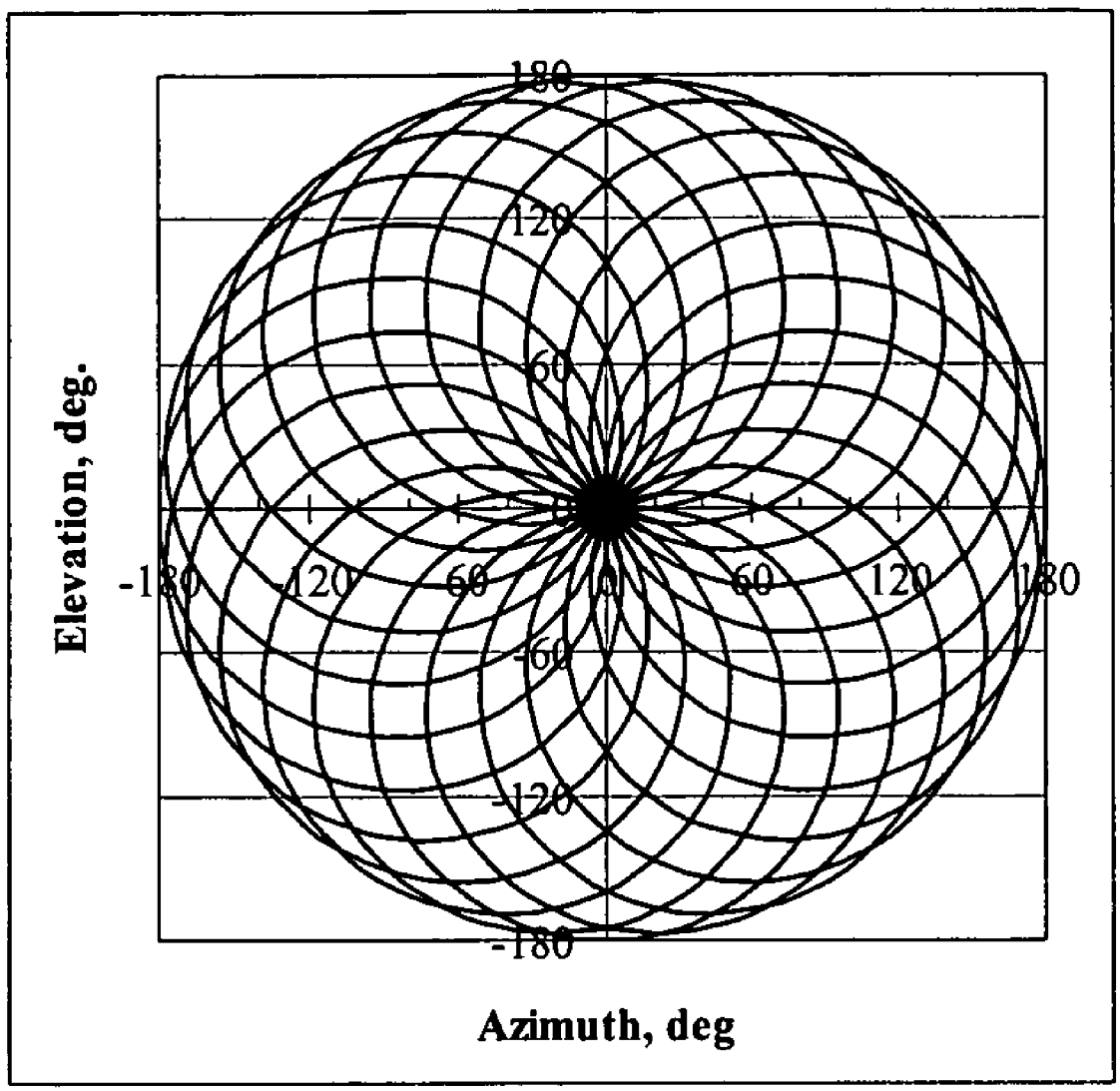
FIG. 10 illustrates the trajectory of a laser beam produced by a double grating scanner after a single revolution of the first grating wherein the deflection angle of each grating δ=approximately 90° and R is rotation rate, $R_2$=approximately $25R_1$.

FIG. 8 shows that maximum deflection angle can be achieved for grating with inclination angle of approximately 90°. Its maximum value is approximately 180°. However, let us continue not to consider incidence angles more that approximately 45° to avoid additional losses and dependence of diffraction efficiency on polarization. In this case, a deflection angle by the single grating would be of approximately 90°. However, spinning of such grating should not be in the plane of glass blank but it should be tilted for approximately 45° as it is shown in FIG. 9. One can see that this device has field of view equal to approximately 360° for both azimuth and elevation. So, this DBS can see the whole space. An example of the scanning pattern approximately 90° DGS is shown in FIG. 10. One can see that actually the whole space is covered by the scanning beam.

It is clear that not only transmitting Bragg gratings could be used for such deflector but reflecting once too. Reflective gratings would provide the same fields of regards as transmitting ones. The difference is in angular and spectral selectivity of those types of gratings. This is why each particular design should be a tradeoff between parameters of laser radiation and parameters of the used Bragg grating.

This invention creates great new opportunities for sophisticated optical system designs in fields of military lasers, optical communications, data storage and processing, and the like.

As an example, a scanning device for He—Ne laser at approximately 633 nm was created on the basis of two Bragg gratings recorded in PTR glass with thickness of approximately 1.5 mm. Refractive index modulation was approximately 300 ppm.

Theoretical diffraction efficiency was approximately 100%, actual diffraction efficiency for collimated beam of He—Ne laser was approximately 93%. Spatial frequency of the grating was about 250 mm$^{-1}$, deflection angle in air approximately 10°. Continuous scanning of laser beam was demonstrated by manually controlled rotary stage. Total transmission of the system consisting of 2 consequent gratings was approximately 87% if Fresnel reflection was taken into account. Total deflection of approximately 180° was resulted from two consequent gratings with opposite orientations was demonstrated on high frequency gratings.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method making and scanning using holograms formed in photo-thermo-refractive (PTR) glasses comprising the steps of:
    optionally exposing PTR glass with a periodic pattern of a source of ionizing radiation;
    exposing the exposed PTR glass with high-power Visible radiation generated by a high power source generating at approximately 10 megawatts/cm$^2$ to approximately 100 gigawatts/cm$^2$;
    thermal treating the radiation exposed PTR glass;
    generating a plurality of holograms in the thermal treated PTR glass as Bragg gratings; and
    replaying holograms formed in the exposed and thermal treated PTR glass with a laser beam, wherein the replaying step comprises the step of:
    spinning a first PTR hologram about it's optical axis while moving a second PTR hologram in an arc so that it is located coincident with a laser beam diffracted by the first PTR hologram and spinning the second PTR hologram about the optical axis of the laser beam diffracted by the first PTR hologram.

2. The method of claim 1, wherein the source of ionizing radiation is a UV light source.

3. The method of claim 2, wherein the step of exposing with the UV light source includes a range of approximately 280 to approximately 350 nm.

4. The method of claim 2, wherein the step of exposing with the UV light source is approximately 325 nm.

5. The method of claim 1 wherein the step of exposing with Visible radiation includes a range of approximately 450 to approximately 600 nm.

6. The method of claim 1 wherein the step of exposing with Visible radiation includes: approximately 532 nm.

7. The method of claim 1 wherein the step of generating a hologram includes the step of:
    generating a plurality of simple holograms having substantially planar surfaces of equal refractive index.

8. The method of claim 1 wherein the step of generating a hologram includes the step of:
    generating a plurality of complex holograms having substantially curved surfaces of equal refractive index.

9. The method of claim 1 wherein the step of thermal treating includes the step of:
    thermal treating the PTR glass in a temperature region ranging from approximately 480 to approximately 580° C. for a period of from a few minutes to several hours appropriate for phase transformation.

10. The method of claim 1, further comprising
    moving a third PTR hologram in an arc so that its optical axis is coaxial with that of a beam diffracted from the second PTR hologram and spinning the third PTR hologram about the optical axis of the laser beam diffracted by the second PTR hologram.

11. A scanner for scanning collimated optical beams at arbitrary angles comprising:
    A first rotary stage mounted with a rotatable first PTR hologram and means for hold and moving in a corresponding arc a second rotary stage mounted with a second PTR hologram, which is able to be rotated, such that its optical axis is coaxial with that of a beam diffracted from the first PTR hologram;
    wherein the holograms are generated in a thermal treated PTR glass that was previously exposed to a UV light source.

12. The scanner for scanning collimated optical beams at arbitrary angles according to claim 11, where said beams include: laser beams.

13. The scanner for scanning collimated optical beams at arbitrary angles according to claim 11, wherein said thermal treated PTR glass was exposed to a high-power Visible light source.

14. The scanner for scanning collimated optical beams at arbitrary angles according to claim 11 wherein said Bragg gratings are planar.

15. The scanner for scanning of claim 11 wherein the UV exposure includes a range of approximately 280 nm to approximately 350 nm.

16. The scanner for scanning of claim 11, wherein the UV exposure is approximately 325 nm.

17. The scanner for scanning of claim 11 wherein the PTR glass if further exposed to Visible light exposure that includes a range of approximately 450 nm to approximately 600 nm.

18. The scanner for scanning claim 17 wherein the Visible light exposure is approximately 532 nm.

19. The scanner for scanning of claim 11 wherein the Bragg gratings have substantially planar surfaces of equal refractive index.

20. The scanner for scanning of claim 11 which additionally comprises:
    means attached to the second rotary stage for holding and moving in a corresponding arc a third rotary stage mounted with a third PTR hologram, which is able to be rotated, such that its optical axis is coaxial with that of a beam diffracted from the second PTR hologram.

* * * * *